United States Patent [19]

Onda

[11] Patent Number: 5,119,151
[45] Date of Patent: Jun. 2, 1992

[54] QUASI-ONE-DIMENSIONAL CHANNEL FIELD EFFECT TRANSISTOR HAVING GATE ELECTRODE WITH STRIPES

[75] Inventor: Kazuhiko Onda, Tokyo, Japan
[73] Assignee: NEC Corporation, Tokyo, Japan
[21] Appl. No.: 431,245
[22] Filed: Nov. 3, 1989
[30] Foreign Application Priority Data
  Nov. 7, 1988 [JP] Japan .................. 63-281928
[51] Int. Cl.⁵ ............ H01L 29/80; H01L 27/12; H01L 29/161
[52] U.S. Cl. ............................ 357/22; 357/4; 357/16
[58] Field of Search ............ 357/22 A, 16, 17, 4
[56] References Cited
  U.S. PATENT DOCUMENTS
  4,733,282  3/1988  Chang et al. ................ 357/4
  4,796,068  1/1989  Katayama et al. ............ 357/4

Primary Examiner—Rolf Hille
Assistant Examiner—Roy Potter
Attorney, Agent, or Firm—Sughrue, Mion, Zinn, Macpeak & Seas

[57] ABSTRACT

A quasi-one-dimensional channel field effect transistor is suitable for an ultra high speed operation due to reduction in scattering, and comprises a quantum well structure for producing a two dimensional carrier gas, a etching stopper layer formed on the quantum well structure for providing a heterojunction, and an electron supplying structure formed on the etching stopper layer shaped in a mesa array for dividing the two dimensional carrier gas into quasi-one-dimensional quantum wires and a metal gate electrode having a top surface tracing the top surfaces of the mesa array, in which the quantum well structure has a quantum well capable of accumulating a large amount of carrier gas, so that the etching stopper layer and the electron supplying structure are formed of compound semiconductor materials in the same compound system but different in the molar fraction of one of the compositional element for imparting a large selectivity to an etchant used for the mesa array.

14 Claims, 8 Drawing Sheets

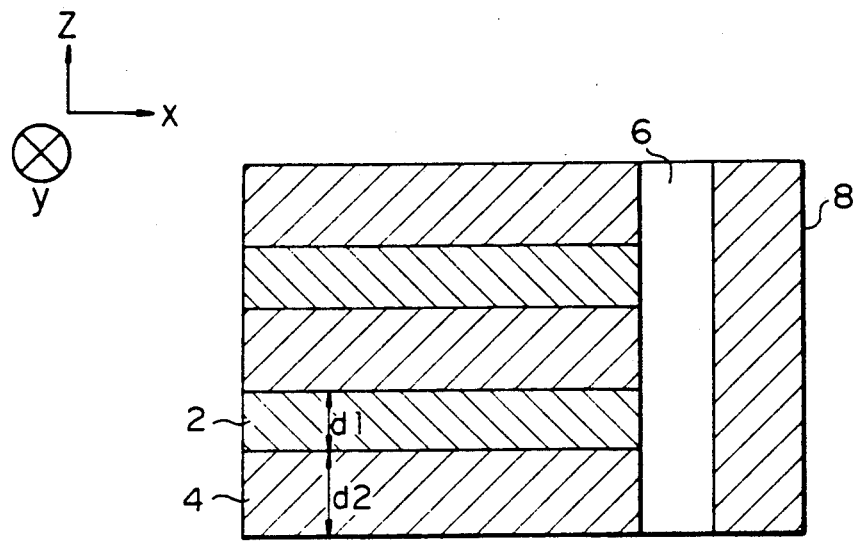
FIG. 1A
PRIOR ART
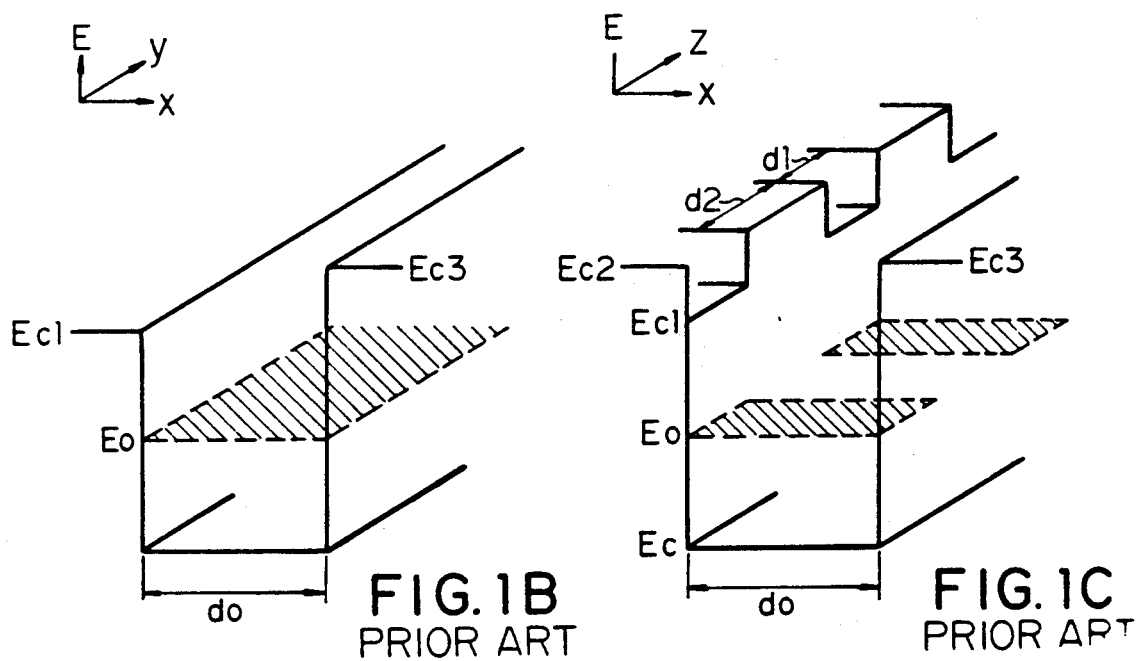
FIG. 1B
PRIOR ART
FIG. 1C
PRIOR ART

QUASI-ONE-DIMENSIONAL CHANNEL FIELD EFFECT TRANSISTOR HAVING GATE ELECTRODE WITH STRIPES

FIELD OF THE INVENTION

This invention relates to an ultra high speed field effect transistor and, more particularly, to a striped gate structure of the field effect transistor for producing quantum wires serving as a quasi-one-dimensional conducting channel.

DESCRIPTION OF THE RELATED ART

Development of epitaxial growth attains a strict control of a film thickness, and the epitaxial growing technique such as a molecular beam epitaxy or an atomic layer epitaxy achieves a heterojunction structure controllable within a turbulence of the order of one or two atomic layers. When the heterojunction structure is selectively doped with impurity atoms, a two-dimensional electron gas takes place for achievement of an extremely high electron mobility.

On the other hand, miniaturization of component transistors achieves an ultra large scale integration where the gate electrodes of the component transistors are of the order of a quarter micron in a commercial product, and the gate electrode of the component field effect transistor is less than 0.1 micron on the laboratory basis.

Those precise crystal growing techniques as well as the miniaturization techniques are applied to an ultra high speed semiconductor device, and the device characteristics are drastically enhanced. For example, the modulation doped structure for production of the two-dimensional electron gas is of the two-dimensional family, and is eminent for the extremely high speed and low noise characteristic. However, the above mentioned techniques are available for fabricating a lower or one dimensional family. If quantum wires are decreased in the diameter approximately equal to the wavelength of the de Broglie wave, an ultra high mobility would be achieved, and, for this reason, research and development efforts are made for the one dimensional conducting phenomenon as well as fabrication techniques of the one dimensional semiconductor device. In the quantum wires thus decreased in the diameter, the kinetic energy of the electrons are quantized, and, the electrons tend to exhibit a one dimensional behavior. The one dimensional device is less liable to be affected by the potential produced by the doped impurity atoms, and is, therefore, expected to achieve an ultra high speed operation in comparison with the two or three dimensional devices.

Several structures are proposed for one dimensional semiconductor devices, and, for example, FIG. 1A shows the structure proposed by Y. C. Chang et al in "A NEW ONE-DIMENSIONAL QUANTUM WELL STRUCTURE", Applied Physics Letters, vol. 47, pages 1324 to 1326. Reference numeral 2 and 4 designate two aluminum gallium arsenide layers different in the aluminum content (which are respectively indicated by $Ga_{1-x1}Al_{x1}As$ and $Ga_{1-x2}Al_{x2}As$ in the letter) for fabricating a superlattice structure, and the gallium aluminum arsenide layers 2 and 4 have respective thicknesses d1 and d2. A gallium arsenide quantum well layer 6 is formed on one side of the superlattice structure, and an gallium aluminum arsenide potential barrier layer 8 sandwiches the gallium arsenide quantum well layer 6 together with the superlattice structure. The gallium aluminum arsenide potential barrier layer 8 is further different in the aluminum content from the layers 2 and 4, and is indicated by $Ga_{1-x3}Al_{x3}As$ in the Chang's letter.

As will be seen from FIGS. 1B and 1C, one dimensional quantum wires take place in the gallium arsenide quantum well layer 6 due to differences in potential level between the $Ga_{1-x1}Al_{x1}As/GaAs/Ga_{1-x3}Al_{x3}As$ structure and the $Ga_{1-x2}Al_{x2}As/GaAs/Ga_{1-x3}Al_{x3}As$ structure, and the quantum wires are conducive to an ultra high speed operation.

Another structure for the one dimensional semiconductor device is proposed by David B. Rensch et al in "Performance of the Focused-Ion-Striped Transistor (FIST)—A New MESFET Structure Produced by Focused-Ion-Beam Implantation", IEEE TRANSACTIONS ON ELECTRON DEVICES, vol. ED-34, No. 11, November 1987, pages 2232 to 2237. The structure proposed by Rensch et al is shown in FIG. 2, and is fabricated on an undoped gallium arsenide substrate. Source and drain regions 14 and 16 are formed on the substrate in a spacing relationship with each other, and a high resistive film 18 is provided between the source and drain regions 14 and 16. In the high resistive film 18 is produced high-conductive stripes at an interval ranging between 0.2 micron to 0.5 micron through a scanning focused-ion-beam implantation process of silicon, and the scanning focused ion beam 20 achieves the stripes having width each equal to that of the focused-ion beam of the order of 0.2 micron. The high resistive film 18 is overlain by a gate electrode 22, and the channel with the conductive stripes is controlled by the gate electrode 22.

Still another structure is disclosed by Makoto Okada et al in "Quasi-one-dimensional Channel GaAs/AlGaAs modulation Doped FET Using Corrugated Gate Structure", Extended Abstracts of the 20th (1988 International) Conference on Solid State Devices and Materials, Tokyo 1988, pages 503 to 506. In this structure, the channel area is associated with a corrugated gate, and the corrugated gate changes the electron gas confinement from the conventional two dimensional configuration to an array of one dimensional electron gas channels. The corrugated gate is formed by using a holographic He-Cd laser exposure.

However, a problem is encountered in each of the prior art structures described hereinbefore in complicate fabrication process, because the prior art process contains a hardly reproducible stage such as a recrystallization.

It is considered that one of the easiest approaches for the quantum wires is provision of a two dimensional electron gas layer formed in a mesa array configuration. If a gate electrode is shared by the mesa-shaped portions, the two dimensional electron gases are discretely produced in the mesa-shaped portions, respectively. Although the mesa array hardly provides the strict one dimensional quantum wires, quasi-one-dimensional quantum wires produced in the mesa array fairly exhibit various attractive properties inherent in the quantum wires. Thus, the mesa array is conducive to provision of the quasi-one-dimensional quantum wire structure.

However, drawbacks are encountered in the semiconductor structure with the mesa array structure in a large amount of the leakage current and in the low withstand voltage level. This is because of the fact that the two dimensional electron gases are brought into contact with the metal gate electrode along the respective edges of the mesa portions.

The physical contact is not the case between the two dimensional electron gas and the metal gate electrode of the conventional modulation doped field effect transistor because of a negligible amount of contacting area, however, the increased contact area is serious in the semiconductor device with the quasi-one-dimensional quantum wire structure fabricated by the mesa array configuration. If the semiconductor device is fabricated by using compound semiconductor materials in the indium gallium arsenide/indium aluminum arsenide system, the semiconductor device is seriously deteriorated in characteristics in an practical operation.

APPROACH TO THE QUASI-ONE-DIMENSIONAL QUANTUM WIRES

An etching stopper may be effective for controlling the depth of cleavages around the mesa portions, and the etching stopper can be formed by a spacer film of the order of ten angstroms provided over the channel forming layer. If the etching stopper is directly formed on the channel forming layer prior to the etching stage for the mesa array configuration, the etching would not proceed to the channel forming layer, and, for this reason, the two dimensional electron gases are prevented from any direct contact with the metal gate electrode.

However, the etching stopper is causative of another drawbacks. In detail, if an electron supplying layer of doped aluminum gallium arsenide is provided in a two dimensional electron gas field effect transistor, the etching stopper is formed of an undoped or intrinsic aluminum gallium arsenide. If a large difference in aluminum content is provided between the doped aluminum gallium arsenide for the electron supplying layer and the undoped aluminum gallium arsenide for the etching stopper, the etching stopper effectively prevents the heterojunction between the undoped aluminum gallium arsenide and an inversion layer in a gallium arsenide film from the contact with the metal gate electrode. However, when the undoped aluminum gallium arsenide is drastically decreased in the aluminum content, the carrier density of the two dimensional electron gas in the inversion layer is also drastically reduced, and, accordingly, the field effect transistor suffers from the deterioration in the characteristics.

If, on the other hand, the undoped aluminum gallium arsenide for the etching stopper is not so different in the aluminum content from the doped aluminum gallium arsenide for the electron supplying layer, the etchant is much liable to reach the heterojunction beyond the etching stopper due to a low selectivity of the etchant. Thus, there is a trade off between the selectivity and the carrier density of the two dimensional electron gas, and, for this reason, the mesa array structure is hardly applied to the two dimensional electron gas field effect transistor.

SUMMARY OF THE INVENTION

It is therefore an important object of the present invention to provide a quasi-one-dimensional channel field effect transistor which is free from the deterioration in the device characteristics as well as the reverse leakage current at the gate electrode.

It is also an important object of the present invention which effectively spaces a channel forming layer from a metal gate electrode.

To accomplish these objects, the present invention proposes to provide a quantum well layer adjacent to an etching stopper. Since a large amount of two dimensional electron gas takes place in the quantum well, the etching stopper is allowed to be drastically shifted in the molar fraction of a compositional element from the electron supplying layer and, accordingly, the drastic shift enhances the selectivity of the etchant.

In accordance with one aspect of the present invention, there is provided a quasi-one-dimensional channel field effect transistor fabricated on a semi-insulating substrate, comprising: (a) a quantum well structure formed on the semi-insulating substrate and having a quantum well layer of a first compound semiconductor material and a potential barrier layer of a second compound semiconductor material for providing a potential barrier to a two dimensional carrier gas in the quantum well layer; (b) an etching stopper layer of a third compound semiconductor material formed on the quantum well structure for providing a heterojunction between the second and third compound semiconductor materials; (c) an electron supplying structure of a fourth compound semiconductor material formed on the etching stopper layer and shaped into a mesa array for exposing parts of the etching stopper layer, the mesa array extending in a first direction; (d) a metal gate electrode covering the electron supplying structure and the parts of the etching stopper layer; and (e) source and drain electrodes provided on both sides of the metal gate electrode and electrically connected to the quantum well layer, the source and drain electrodes be spaced in a direction substantially parallel to the first direction, in which the third and fourth compound semiconductor materials are identical in compositional elements with each other, but are different in the molar fraction of one of the compositional elements so that a large selectivity is imparted to an etchant used for formation of the mesa array.

In accordance with another aspect of the present invention, there is provided a process of fabricating a quasi-one-dimensional channel field effect transistor, comprising the steps of: (a) preparing a semi-insulating substrate of gallium arsenide; (b) successively growing an intentionally undoped gallium arsenide film, an intentionally undoped indium gallium arsenide film, an intentionally undoped aluminum gallium arsenide film and a doped aluminum gallium arsenide film on the semi-insulating substrate, the intentionally undoped gallium arsenide film, the intentionally undoped indium gallium arsenide film and the intentionally undoped aluminum gallium arsenide film serving as a potential barrier layer, a quantum well layer and an etching stopper layer, respectively; (c) shaping the doped aluminum gallium arsenide film into a mesa array having a plurality of mesa-shaped portions extending in a first direction, the etching stopper layer being partially exposed between the mesa-shaped portions, the mesa array serving as a carrier supplying structure; (d) forming source and drain regions on the carrier supplying structure in a spacing relationship from each other in a direction substantially in parallel to the first direction; and (e) forming a metal gate electrode partially on the carrier supplying structure and partially on the etching stopper layer between the source and drain electrodes.

BRIEF DESCRIPTION OF THE DRAWINGS

The features and advantages of a quasi-one-dimensional channel field effect transistor according to the present invention will be more clearly understood from the following description taken in conjunction with the accompanying drawings in which:

FIG. 1A is a cross sectional view showing the structure proposed by Y. C. Chang et al;

FIG. 1B is an energyband diagram showing a potential profile produced in the x-y plane of the structure shown in FIG. 1A;

FIG. 1C is an energyband diagram showing a potential profile produced in the x-z plane of the structure shown in FIG. 1A;

DESCRIPTION OF THE PREFERRED EMBODIMENT

Figure 2:
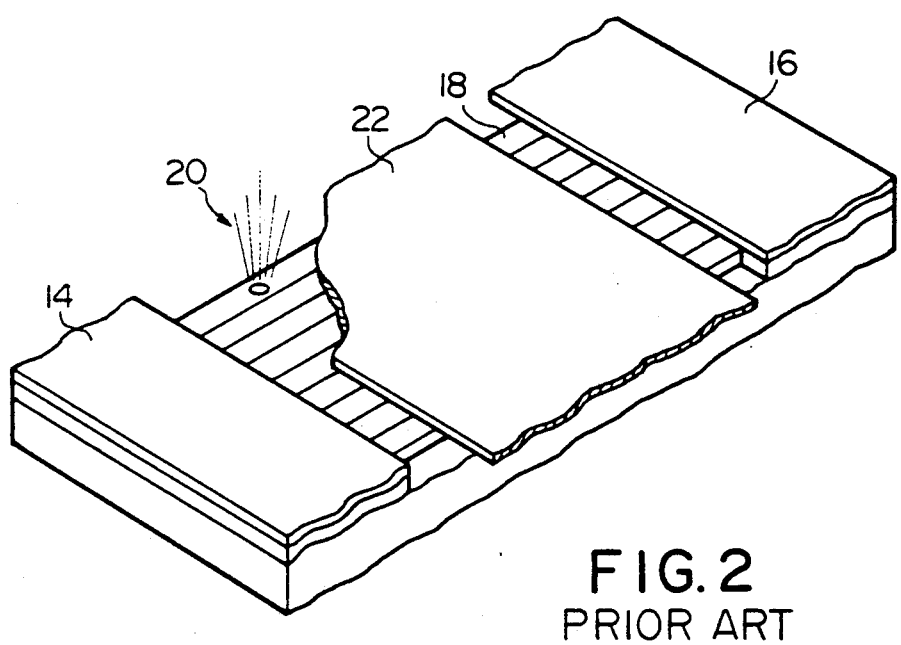
FIG. 2 is a perspective view showing the structure proposed by Rensch.
Figure 3:
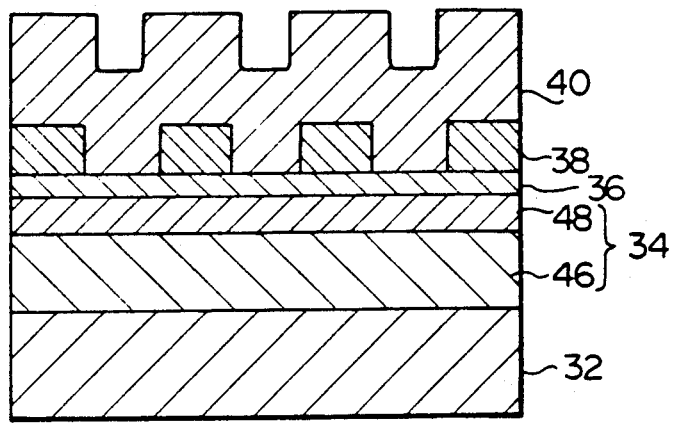
FIG. 3 is a cross sectional view showing a quasi-one-directional channel field effect transistor embodying the present invention.
Figure 4:
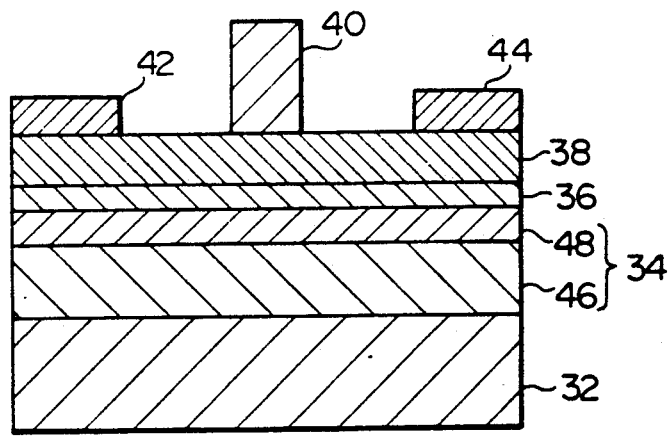
FIG. 4 is a cross sectional view at a different angle showing the quasi-one-dimensional channel field effect transistor shown in FIG. 3.

Referring first FIGS. 3 and 4 of the drawings, a quasi-one-directional channel field effect transistor according to the present invention is fabricated on a high-resistive or semi-insulating substrate 32 of gallium arsenide, and largely comprises a quantum well structure 34, an etching stopper layer 36 of an intentionally undoped aluminum gallium arsenide represented by the molecular formula of $Al_yGa_{1-y}As$, an electron supplying structure 38 shaped into a mesa array and formed of a doped aluminum gallium arsenide represented by the molecular formula of $Al_xGa_{1-x}As$, a metal gate electrode 40 having a top surface tracing the top surfaces of the mesa array, and source and drain electrodes 42 and 44. In this instance, suffix x is about 0.15, and suffix y is about 0.3. However, these suffixes can be arbitrarily selected in so far as the suffix y is greater than the suffix x.

The quantum well structure 34 has a potential barrier layer 46 formed of an intentionally undoped gallium arsenide and a quantum well layer 48 of an intentionally undoped indium gallium arsenide. The potential barrier layer 46 is thick enough to avoid any influence of the substrate 32 on a channel formed in the quantum well layer 48, and the quantum well layer 48 is about 150 angstroms thick in this instance. The channel stopper layer 36 is about 30 angstroms in thickness, and the electron supplying structure 38 is as thick as about 500 angstroms. The doped aluminum gallium arsenide has an n-type impurity atom concentration of about $2 \times 10^{18}$ $cm^{-2}$. The electron supplying structure 38 has a plurality of mesa-shaped portions extending in parallel to one another and to a direction where the source and drain regions 42 and 44 are spaced from each other. Several specimens are fabricated for variation in the width of each mesa-shaped portion, i.e., 0.5 micron, 0.25 micron and 0.1 micron. The properties of the one-dimensional quantum wires are achieved by all of the specimens, and the reverse leakage current is drastically decreased at the gate electrode 40 by virtue of the etching stopper layer 36. Moreover, since the quantum well accumulates a large amount of two dimensional electron gas, the field effect transistor with the structure shown in FIGS. 3 and 4 does not suffer from the deterioration in the device characteristics such as a transconductance. In fact, when the doped aluminum gallium arsenide is decreased in the molar fraction of aluminum to about 0.15, no serious deterioration takes place in the field effect transistor. The quantum well layer 48 serves as a deformation layer, and the thickness thereof is about 150 angstroms in this instance. However, the thickness of the quantum well layer may be less than about 150 angstroms in thickness in another instance.

The small molar fraction of aluminum is further advantageous in reduction of the amount of undesirable deep energy level such as DX center in the aluminum gallium arsenide, and, for this reason, the field effect transistor according to the present invention is improved in pinch off characteristics.

Figure 5A:
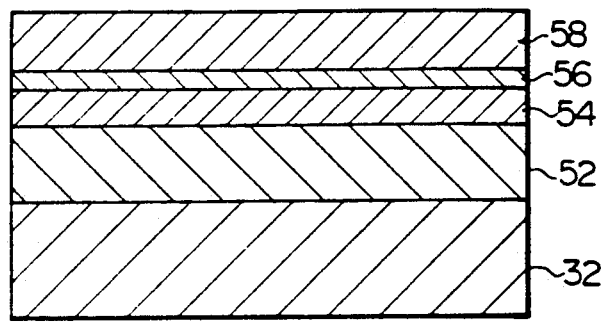
FIGS. 5A to 5D are cross sectional views showing an earlier part of a process sequence for fabricating the quasi-one-dimensional channel field effect transistor shown in FIGS. 3 and 4.

Description is made for a process for fabricating the quasi-one-dimensional channel field effect transistor with reference to FIGS. 5A to 5D and, concurrently, FIGS. 6A to 6E. The process start with preparation of the semi-insulating substrate 32. On the semi-insulating substrate 32 are deposited an intentionally undoped gallium arsenide film 52 for the potential barrier layer 46, an intentionally undoped indium gallium arsenide film 54 for the quantum well layer 48, an intentionally undoped aluminum gallium arsenide film 56 for the etching stopper layer 36 and a doped aluminum gallium arsenide film 58 for the electron supplying structure 38 which are successively grown by using, for example, a molecular beam epitaxy. The resultant structure of this stage is shown in FIG. 5A.

Figure 5B:
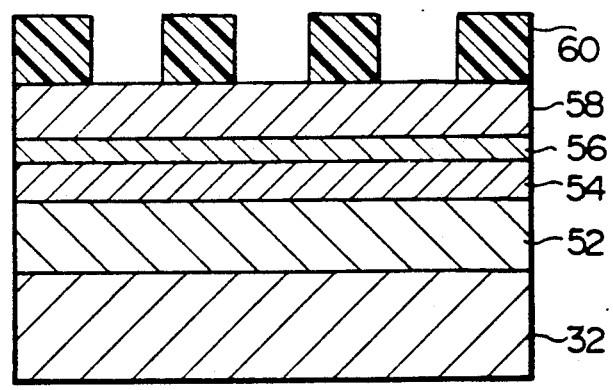
Figure 5C:
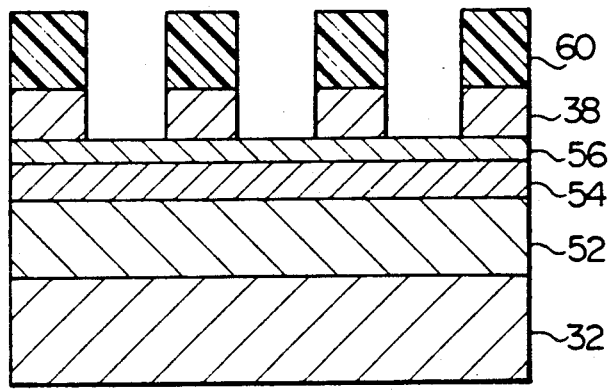
Figure 5D:
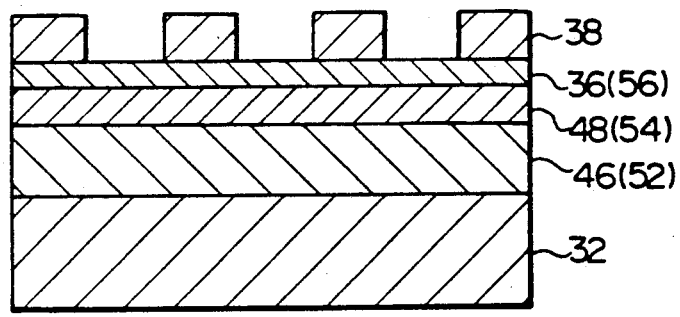

The doped aluminum gallium arsenide film 58 is coated with a photoresist film, and, then, the photoresist film is patterned to provide a mask layer 60 as shown in FIG. 5B. With the mask layer 60, the doped aluminum gallium arsenide film is etched by using a reactive ion etching technique so as to be shaped into the mesa array, and a gaseous mixture containing a halogen is introduced into a reactor (not shown) for the reactive ion etching. A large difference in the molar fraction of aluminum between the intentionally undoped aluminum gallium film 56 and the doped aluminum gallium arsenide film 58 allows the gaseous mixture or the etchant to have a large selectivity, and, for this reason, the etching stopper layer 36 of about 30 angstroms is sufficiently effective to restrict the reactive ion etching. Then, only the doped aluminum gallium arsenide film 58 is shaped into the mesa array, but the intentionally undoped gallium arsenide film 56 remains on the intentionally undoped indium gallium arsenide film 54 as shown in FIG. 5C. When the mask layer 60 is stripped off, a plurality of the mesa-shaped portions of the electron supplying structure 38 are left on the channel stopper layer, and extend in parallel to one another as shown in FIG. 5D.

Figure 6A:
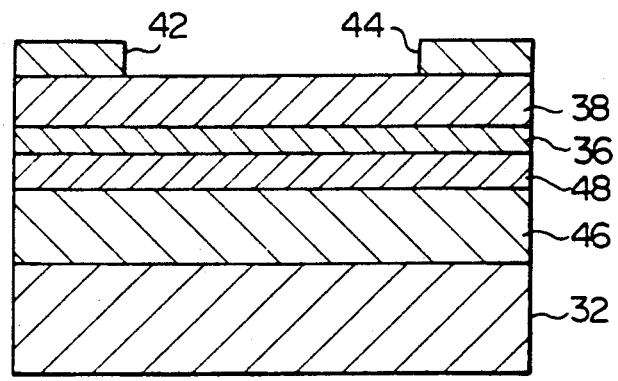
FIGS. 6A to 6E are cross sectional views at a different angle showing a later part of the process sequence for fabricating the quasi-one-dimensional channel field effect transistor illustrated in FIGS. 3 and 4.

Subsequently, a photoresist is spun onto its entire surface of the structure, and the photoresist film is patterned to expose source and drain forming areas on the mesa-shaped portions. A metal is then evaporated over the patterned photoresist film as well as the source and drain forming areas, and the photoresist film is removed from the structure so that source and drain electrodes 42 and 44 are formed on the electron supplying structure 38. The source and drain electrodes 42 and 44 are in contact with the electron supplying structure 38 in an ohmic fashion, and are spaced apart from each other in a direction parallel to the mesa-shaped portions. This configuration allows extremely narrow channels or quasi-one-directional quantum wires to take place between the source and drain electrodes 42 and 44. Thus, the source and drain electrodes are formed by using the lift-off technique, however, the source and drain regions may be associated with highly conductive regions produced by an ion implantation previously carried out. The resultant structure of this stage is shown in FIG. 6A.

Figure 6B:
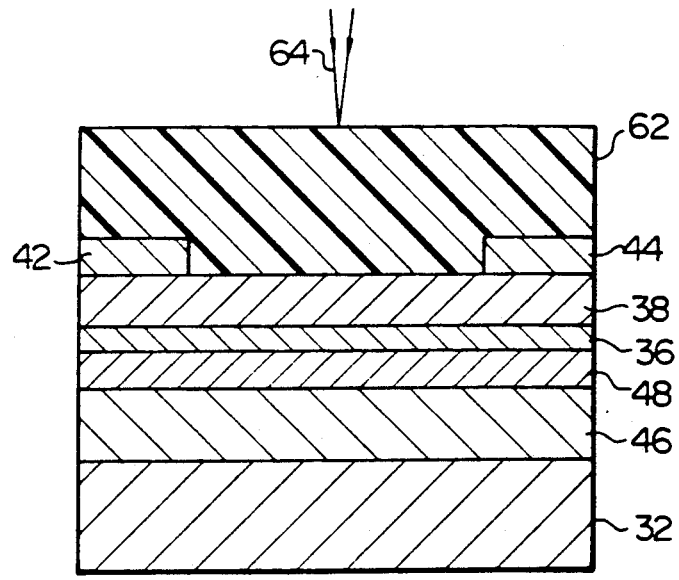
Figure 6C:
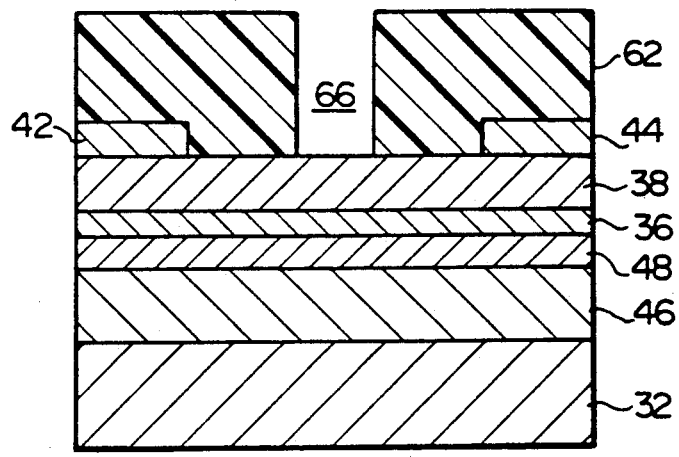
Figure 6D:
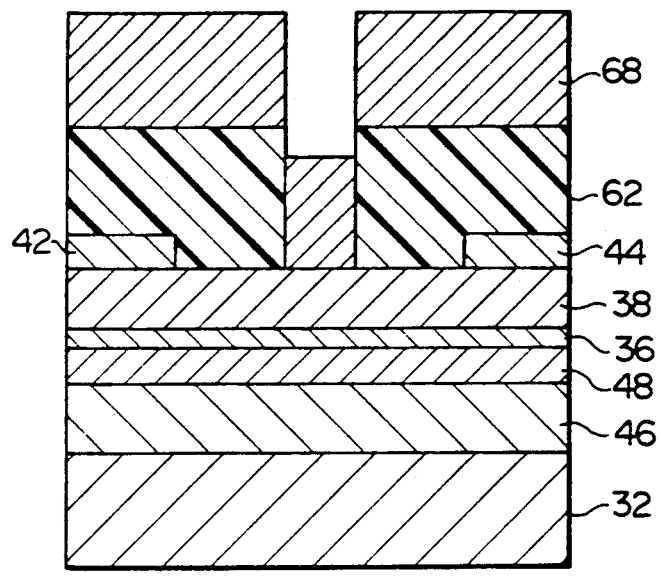
Figure 6E:
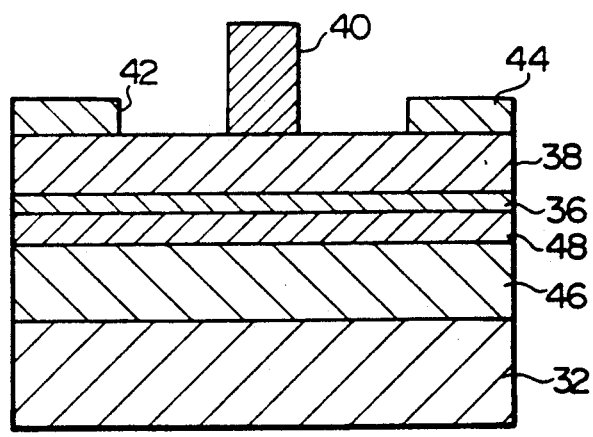

After the formation of the source and drain electrodes 42 and 44, a gate electrode is formed between the source and drain electrodes 42 and 44 by repetition of the lift-off process. In this connection, an electron beam lithography is superior in view of formation of a miniature gate electrode. For example, a resist 62 of, for example, poly-methyl-meth-acrylate is coated on the entire surface as shown in FIG. 6B, and an electron beam 64 are directly radiated upon the resist 62 to define an opening area. The resist thus directly scanned by the electron beam 64 is developed to form an opening 66 as shown in FIG. 6C, and a metal such as an alloy 68 of titanium and aluminum or of titanium, platinum and gold is deposited over the entire surface by using vacuum evaporation technique. Finally, the resist 62 is stripped off, and the metal gate electrode 40 is left partially on the electron supplying structure 38 and partially on the etching stopper layer 36. Since the electron supplying structure 38 is shaped into the mesa array, the top surface of the metal gate electrode 40 is traced along the mesa array, however, there is no problem if the metal gate electrode 40 is provided on the electron supplying structure 38 only. This means that the parts of the metal gate electrode 40 may be removed from the etching stopper layer 36. The resultant structure of this stage is shown in FIG. 6E.

Figure 7:
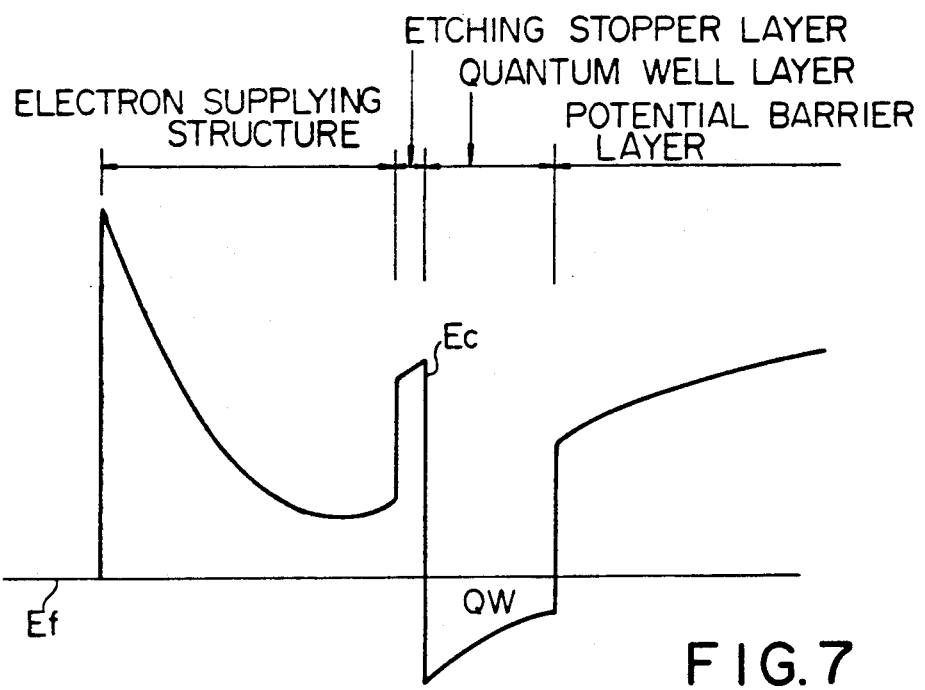
FIG. 7 is an energyband diagram showing the potential profile produced in the quasi-one-dimensional channel field effect transistor shown in FIGS. 3 and 4.
Figure 8:
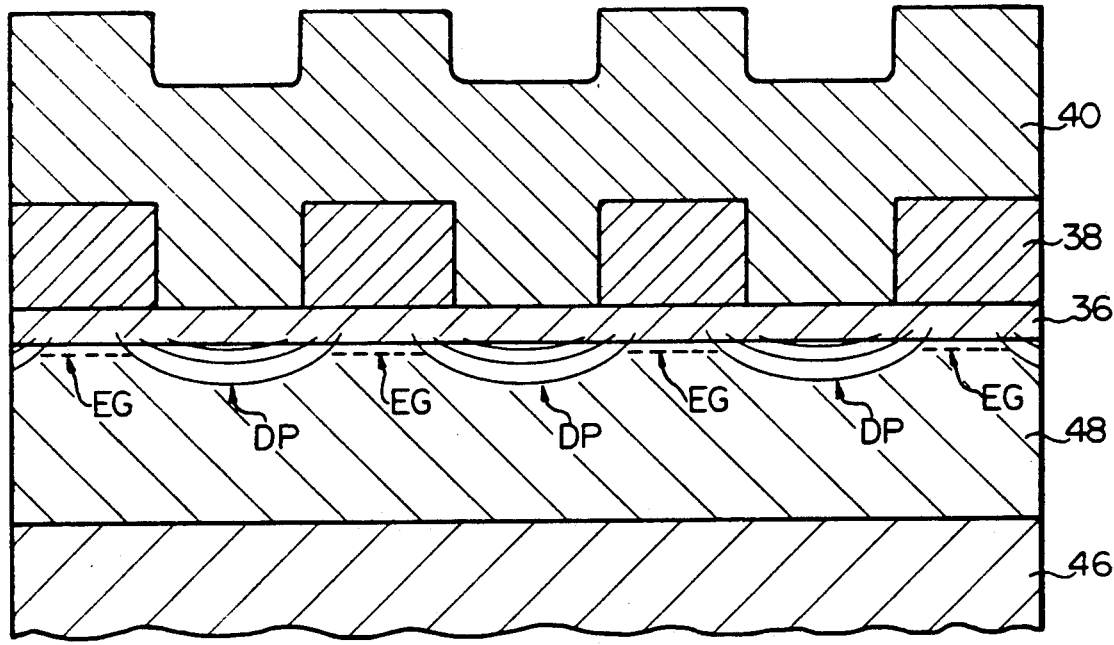
FIG. 8 is a cross sectional view showing quasi-one-dimensional quantum wires produced in the field effect transistor shown in FIGS. 3 and 4.

The quasi-one-dimensional channel field effect transistor thus fabricated allows a potential profile to take place therein as shown in FIG. 7 where Ec and Ef respectively indicate the bottom edge of the conduction band and the Fermi level. As will be seen from FIG. 7, a quantum well QW takes place, and electrons are supplied from the electron supplying structure 34 to the quantum well QW in an active mode of operation. Since a large amount of electrons are accumulated in the quantum well QW, the quasi-one-dimensional channel field effect transistor is free from the reduction of transconductance even if the electron supplying structure 34 is small in the molar fraction of aluminum. The electrons thus supplied to the quantum well QW are of the two dimensional electron gases EG located under the mesa-shaped portions of the electron supplying structure 38. Since the mesa-portions are narrow in width, the two dimensional electron gases are assumed to be one-dimensional quantum wires. Moreover, the metal gate electrode 40 is brought into contact with the etching stopper layer 36, and depletion layers DP extends into the quantum well layer 48, so that the electron gases EG are further restricted in width. This results in that the quasi-one-dimensional electron gases are produced in the quantum well QW even if the mesa-shaped portions are not so extremely narrow. In fact, the mesa-shaped portions of 0.5 micron width can produce the quasi-one-dimensional quantum wires according to the present invention, and the mesa-shaped portions of 0.25 micron width clearly produces the quasi-one-dimensional quantum wires.

As to the geometry of the mesa array, each mesa-shaped portion of the doped aluminum gallium arsenide has a width ranging from about 0.1 micron and about 0.5 micron. Although the projecting length is varied by changing the voltage level applied to the gate electrode, each of the depletion layers projects from the edge of the mesa-shaped portion by a length of about 0.05 micron. If the width is not greater than 0.1 micron, no channel takes place below the mesa-shaped portions. This is the reason why the mesa-shaped portion is not less than 0.1 micron. On the other hand, if the mesa-shaped portion is greater than 0.5 micron, the electron gases behaves as the two-dimensional electron gases, and, the operation speed tends to be deteriorated due to the undesirable scattering. The gap between the adjacent two mesa-shaped portions is preferably equal to or greater than 0.25 micron. If the gap is smaller than 0.25 microns, the adjacent electron gases are affected to each other, and all of the electron gases behaves as a single two dimensional electron gas. This results in the deterioration in the operation speed.

Although particular embodiments of the present invention have been shown and described, it will be obvious to those skilled in the art that various changes and modifications may be made without departing from the spirit and scope of the present invention.

What is claimed is:

1. A quasi-one-dimensional channel field effect transistor fabricated on a semi-insulating substrate, comprising:
   (a) a quantum well structure formed on said semi-insulating substrate and having a quantum well layer of a first compound semiconductor material and a potential barrier layer of a second compound semiconductor material for providing a potential barrier to a two dimensional carrier gas in the quantum well layer;
   (b) an etching stopper layer of a third compound semiconductor material formed on said quantum well structure for providing a heterojunction between said second and third compound semiconductor materials;
   (c) an electron supplying structure of a fourth compound semiconductor material formed on said etching stopper layer and shaped into a mesa array for exposing parts of said etching stopper layer, said mesa array extending in a first direction, carrier paths taking place beneath said mesa array;
   (d) a metal gate electrode covering said electron supplying structure and said parts of said etching stopper layer; and
   (e) source and drain electrodes provided on both sides of said metal gate electrode and electrically connected to said quantum well layer, said source and drain electrodes being spaced in a direction substantially parallel to said first direction, in which said third and fourth compound semiconductor materials are identical in compositional elements with each other, but are different in the molar fraction of one of the compositional elements so that a large selectivity is imparted to an etchant used for formation of said mesa array.

2. A quasi-one-dimensional channel field effect transistor as set forth in claim 1, in which said metal gate electrode has a top portion with a top surface tracing the top surfaces of said mesa array.

3. A quasi-one-dimensional channel field effect transistor as set forth in claim 2, in which said first compound semiconductor material is smaller in electron affinity than said second and third compound semiconductor materials.

4. A quasi-one-dimensional channel field effect transistor fabricated on a semi-insulating substrate, comprising:
  (a) a quantum well structure formed on said semi-insulating substrate and having a quantum well layer of a first compound semiconductor material and a potential barrier layer of a second compound semiconductor material for providing a potential barrier to a two dimensional carrier gas in the quantum well layer;
  (b) an etching stopper layer of a third compound semiconductor material formed on said quantum well structure for providing a heterojunction between said second and third compound semiconductor materials;
  (c) an electron supplying structure of a fourth compound semiconductor material formed on said etching stopper layer and shaped into a mesa array for exposing parts of said etching stopper layer, said mesa array extending in a first direction;
  (d) a metal gate electrode covering said electron supplying structure and said parts of said etching stopper layer; and
  (e) source and drain electrodes provided on both sides of said metal gate electrode and electrically connected to said quantum well layer, said source and drain electrodes being spaced in a direction substantially parallel to said first direction, in which said third and fourth compound semiconductor materials are identical in compositional elements with each other, but are different in the molar fraction of one of the compositional elements so that a large selectivity is imparted to an etchant used for formation of said mesa array, and in which said metal gate electrode has a top portion with a top surface tracing the top surfaces of said mesa array, wherein said first compound semiconductor material is smaller in electron affinity than said second and third compound semiconductor materials, said potential barrier layer and said etching stopper layer being respectively formed on an intentionally undoped gallium arsenide and an intentionally undoped aluminum gallium arsenide, said first compound semiconductor material being selected from the group consisting of an intentionally undoped indium gallium arsenide and an indium arsenide.

5. A quasi-one-dimensional channel field effect transistor fabricated on a semi-insulating substrate, comprising:
  (a) a quantum well structure formed on said semi-insulating substrate and having a quantum well layer of a first compound semiconductor material and a potential barrier layer of a second compound semiconductor material for providing a potential barrier to a two dimensional carrier gas in the quantum well layer;
  (b) an etching stopper layer of a third compound semiconductor material formed on said quantum well structure for providing a heterojunction between said second and third compound semiconductor materials;
  (c) an electron supplying structure of a fourth compound semiconductor material formed on said etching stopper layer and shaped into a mesa array for exposing parts of said etching stopper layer, said mesa array extending in a first direction;
  (d) a metal gate electrode covering said electron supplying structure and said parts of said etching stopper layer; and
  (e) source and drain electrodes provided on both sides of said metal gate electrode and electrically connected to said quantum well layer, said source and drain electrodes being spaced in a direction substantially parallel to said first direction, in which said third and fourth compound semiconductor materials are identical in compositional elements with each other, but are different in the molar fraction of one of the compositional elements so that a large selectivity is imparted to an etchant used for formation of said mesa array, and in which said metal gate electrode has a top portion with a top surface tracing the top surfaces of said mesa array, wherein said first compound semiconductor material is smaller in electron affinity than said second and third compound semiconductor materials, said potential barrier layer, said quantum well layer and said etching stopper layer being respectively formed of an intentionally undoped gallium arsenide, an intentionally undoped indium gallium arsenide and an intentionally undoped aluminum gallium arsenide.

6. A quasi-one-dimensional channel field effect transistor as set forth in claim 5, in which said third compound semiconductor material is higher in aluminum content than said fourth compound semiconductor material.

7. A quasi-one-dimensional channel field effect transistor as set forth in claim 6, in which said fourth compound semiconductor material is represented by the molecular formula of $Al_xGa_{1-x}As$ where x is equal to or greater than 0.15.

8. A quasi-one-dimensional channel field effect transistor as set forth in claim 7, in which said third compound semiconductor material is represented by the molecular formula of $Al_yGa_{y-1}As$ where y is about 0.3.

9. A quasi-one-dimensional channel field effect transistor as set forth in claim 8, in which said etching stopper layer is about 30 angstroms in thickness.

10. A quasi-one-dimensional channel field effect transistor as set forth in claim 3, in which said mesa array has a plurality of mesa-shaped portions each having a width not greater than 0.5 micron.

11. A quasi-one-dimensional channel field effect transistor fabricated on a semi-insulating substrate, comprising:
  (a) an intentionally undoped gallium arsenide film formed on said semi-insulating substrate;
  (b) an intentionally undoped indium gallium arsenide film formed on said intentionally undoped gallium arsenide film;
  (c) an intentionally undoped aluminum gallium arsenide film formed on said intentionally undoped indium gallium arsenide film;
  (d) a doped aluminum gallium arsenide film formed on said intentionally undoped aluminum gallium arsenide film and shaped into a mesa array for exposing parts of said intentionally undoped aluminum gallium arsenide film, said mesa array having a plurality of mesa-shaped portions extending in a first direction;

(e) a metal gate electrode covering said doped aluminum gallium arsenide film and the parts of said intentionally undoped aluminum gallium arsenide film, and (f) source and drain electrodes provided on both sides of said metal gate electrode and electrically connected to said intentionally undoped indium gallium arsenide film, said source and drain electrodes being spaced apart from each other in said first direction.

12. A quasi-one-dimensional channel field effect transistor as set forth in claim 11, in which the width of each of said mesa-shaped portions is within a range between about 0.1 micron and about 0.5 micron.

13. A quasi-one-dimensional channel field effect transistor as set forth in claim 12, in which every gap between two adjacent mesa-shaped portions is equal to or greater than about 0.25 micron.

14. A quasi-one-dimensional channel field effect transistor as set forth in claim 13, in which said intentionally undoped indium gallium arsenide film is equal to or less than 150 angstroms in thickness.

* * * * *